United States Patent [19]

Snyman et al.

[11] Patent Number: 5,994,720
[45] Date of Patent: Nov. 30, 1999

[54] INDIRECT BANDGAP SEMICONDUCTOR OPTOELECTRONIC DEVICE

[75] Inventors: Lukas W. Snyman, Faerie Glen, South Africa; Herzl Aharoni, Omer, Israel; Monuko DuPlessis, Rietondale, South Africa

[73] Assignee: University of Pretoria, Hatfield, Pretoria, South Africa

[21] Appl. No.: 08/930,322

[22] PCT Filed: Mar. 28, 1996

[86] PCT No.: PCT/EP96/01357

§ 371 Date: Dec. 5, 1997

§ 102(e) Date: Dec. 5, 1997

[87] PCT Pub. No.: WO96/30952

PCT Pub. Date: Oct. 3, 1996

[30] Foreign Application Priority Data

Mar. 4, 1996 [ZA] South Africa ............................ 96/1741

[51] Int. Cl.[6] .................................................. H01L 33/00
[52] U.S. Cl. .................................. 257/86; 257/79; 257/96
[58] Field of Search .................................. 257/200, 465, 257/461, 86, 87, 463, 448, 439, 79, 81, 96, 101, 103

[56] References Cited

U.S. PATENT DOCUMENTS

| 4,837,607 | 6/1989 | Kemmer et al. | 257/465 |
| 5,051,801 | 9/1991 | Van Eijk et al. | 257/465 |
| 5,698,874 | 12/1997 | Hayashi | 257/233 |

OTHER PUBLICATIONS

Yeh, et al., Light Emission of PN Junction, IBM Technical Disclosure Bulletin, vol. 9, No. 7, p. 919, Dec. 1966.

Kramer et al., Industrial CMOS Technology for the Integration of Optical Metrology Systems (Photo–ASICs), Sensors and Actuators A, 34, pp. 21–29, 1992.

Kramer et al., Light–Emitting Devices in Industrial CMOS Technology, Sensors and Actuators A, 37–38, pp. 527–532, 1993.

*Primary Examiner*—Jerome Jackson, Jr.
*Assistant Examiner*—B W Baumeister
*Attorney, Agent, or Firm*—Law Office of Victor E. Libert; Frederick A. Spaeth

[57] ABSTRACT

An optoelectronic device (10) formed in a chip of an indirect bandgap semiconductor material such as silicon is disclosed and claimed. The device comprises a visibly exposed highly doped $n^+$ region (16) embedded at the surface of an oppositely doped epitaxial layer (14), to form a first junction region (15) closed to the surface of the epitaxial layer. When the junction region is reverse biased to beyond avalanche breakdown, the device acts as a light emitting device to the external environment. When it is reversed biased to just below avalanche breakdown it acts as a light detector. The device may further include a further junction region for generating or providing additional carriers in the first junction region, thereby to improve the performance of the device. This further junction can be multiplied to facilitate multi-input signal processing functions where the light emission from the first junction is a function of the electrical signals applied to the further junctions.

15 Claims, 17 Drawing Sheets

P-EPITAXIAL LAYER

74

P-EPITAXIAL LAYER

74

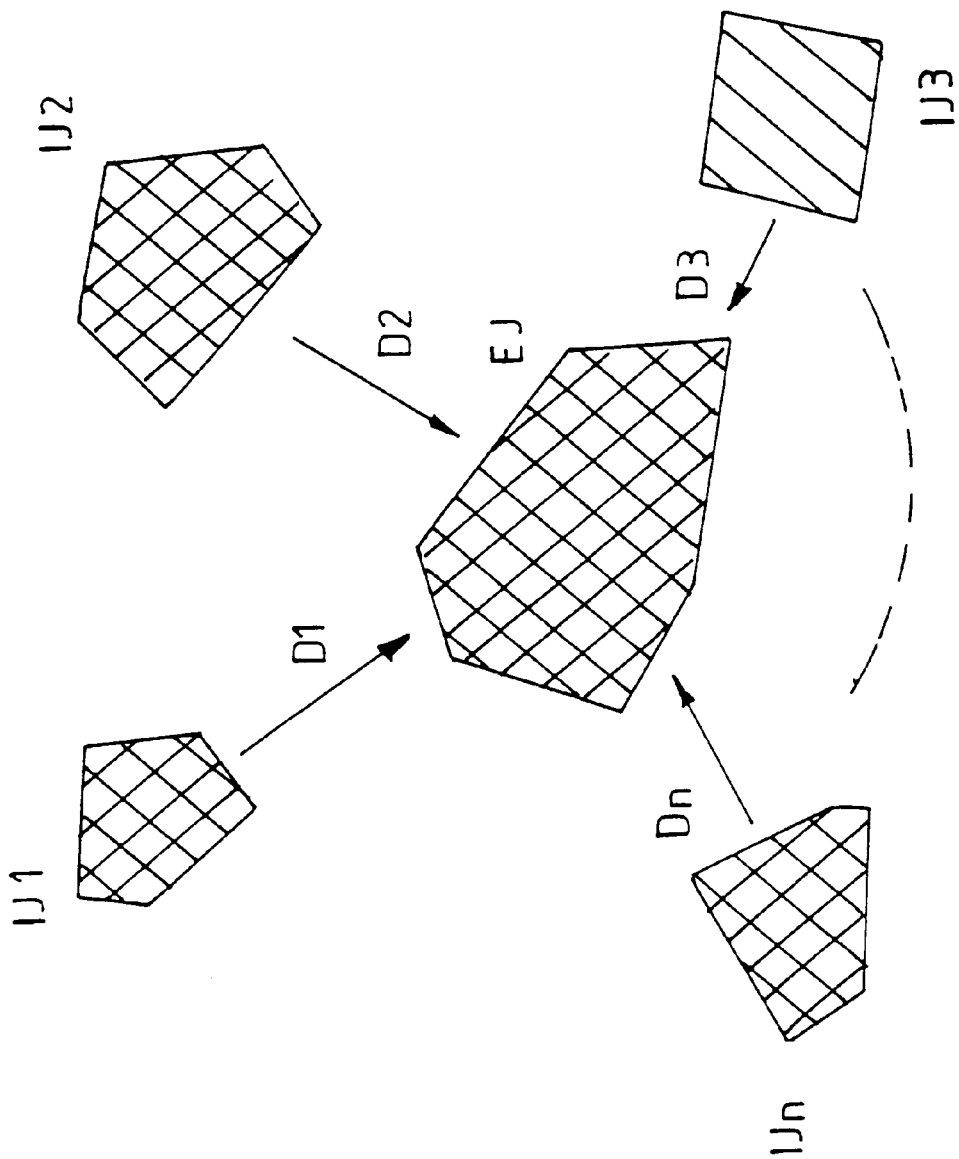

INDIRECT BANDGAP SEMICONDUCTOR OPTOELECTRONIC DEVICE

INTRODUCTION AND BACKGROUND

This invention relates to indirect bandgap semiconductor technology (such as silicon integrated circuit technology and more particularly to discrete and monolothically integrated opto-electronic devices produced from these semiconductor materials.

The present known solid state light emitting devices comprise complex structures of composite direct bandgap semiconductor material from the Group II, III, V and VI elements, for example gallium-arsenide-phosphide. These devices are expensive, are not operationally compatible with the signal processing circuitry found on silicon integrated circuits and cannot monclithically be integrated with the existing silicon integrated circuit technology.

OBJECT OF THE INVENTION

It is an object of the present invention to provide an optoelectronic device and a method of producing same with which the applicant believes the aforementioned disadvantages may at least be alleviated.

SUMMARY OF THE INVENTION

According to the invention there is provided an optoelectronic device comprising a visibly exposed region of a suitable material adjacent a surface region of a layer of a doped indirect bandgap semiconductor material, to provide a first junction region close to the surface region; the first junction region, in use, being reverse biased, to cause the device to act as an optoelectronic device, either by emitting light outwardly beyond the surface region or to detect incident photons impinging on the device from beyond the surface region.

In a first form the visibly exposed region may comprise a highly, but oppositely doped region of the indirect bandgap semiconductor material and said layer comprises an epitaxial layer; the highly doped region being embedded in the surface region of the epitaxial layer.

The indirect bandgap material may be silicon or any other suitable indirect bandgap material.

The said highly doped region may comprise $n^-$ doped silicon and the epitaxial layer p type silicon. It will be appreciated that complementary doping may be utilized to provide a complementary $p^-$ in n-based silicon structure.

A guard ring structure of lighter doping than the said highly doped region may be provided to circumscribe the said highly doped region and to extend deeper into the epitaxial layer than the highly doped region.

In a first embodiment of the first form the highly doped region may be planar and continuous. It may typically be 0.3 $\mu$m deep, so that the first junction region is located in the order of 0.3 $\mu$m below the surface region of the device.

The defect state density in the said highly doped region is preferably much higher than the defect state density in the epitaxial layer, which layer preferably is substantially defect free. The detect density in the highly doped region is preferably uniformly distributed.

The said highly doped region may be imbedded in a base layer of the same, but higher doping concentration as the epitaxial layer to reduce the avalanche breakdowm voltage of the device.

In another embodiment the said highly doped region may be in the form or shape of a grid embedded in the epitaxial layer so that the first junction region periodically extends up to the surface region of the device, thereby to increase the surface area of the first junction region and to decrease the distance between the first junction region and the surface region.

The grid-like highly doped region may define square regions through which the epitaxial layer or base layer, as the case may be, extends.

In yet another embodiment the said highly doped region may be in the form of a plurality of concentric rings embedded towards the surface region of the epitaxial layer. The concentric rings are inter-connected by resistive doped regions of the same dopant type. A highly, but oppositely doped current feed region nay be provided at a centre of the concentric rings, to be in electrical contact with the epitaxial layer and base layer.

Control gates may be provided between the said current feed region and an adjacent ring as well as between successive rings, to induce inversion of minority carrier towards the surface region, thereby to vary the magnitude of avalanche breakdown current and light emission. The control games are isolated from the semiconductor surface by an isolation layer.

The gates may be resistive gates, extending radially outwardly, so that voltage profiles may be generated in a radial direction in the gates, thereby to facilitite control of uniformity of light emission and the spatial location of the light emission region.

The device may be produced by utilising standard CMOS, BiCMOS and bipolar production techniques. It may be integrated with other components on the same chip or may be produced on its own chip for use as a discrete component.

In a second form the visibly exposed layer may comprise a transparent layer of conductive metal to provide a Schottky-type configuration.

Typically applications of the device include on chip displays, electro-optical coupling interfaces to and from external components, internal electro-optical coupling where a device according to the invention on a chip may act as a light emitting device and another similar device on the same chip may act as a photo-detector. In this case the aforementioned guarding structure preferably defines suitably positioned windows. The windows or interruptions in the guard rings cause breakdown in these regions rather than along a bottom plane of the junction, to enable light to propagate, laterally in the chip. The highly doped region may be made to extend deeper into the epitaxial layer for better lateral emission.

In the devices hereinbefore defined in this specification, the carriers causing light emission are the result of a mere reverse current of minority carriers drifting across the said first junction from a region immediately adjacent the depletion region about the junction region. These carriers are then multiplied in the junction region and are therafter recombined, causing photon generation as a result of the recombination processes.

The invention also provides an optoelectronic device comprising a first layer of a suitable material adjacent a second layer of a doped indirect bandgap semiconductor material, to provide a first junction region at a metallurgical interface between said first layer and said second layer, the first junction region, in use, being reverse biased to beyond avalanche breakdown to cause the device to act as a light emitting device, the light emission being caused by a reverse current drifting cross said first junction region, the device further comprising means for providing additional carriers in said first junction region, thereby to enhance the emission of light by the device.

The means for providing additional carriers in the first junction region may be separately controllable.

In one embodiment it may comprise at least one means for injecting additional carriers into the first junction region. The means for injecting additional carriers into the junction region may comprise a second, but forward biased pn junction region.

In another embodiment the means for providing additional carriers in the first junction region may comprise means for injecting photons into the first junction region where they are absorbed causing additional electron-hole pairs to be formed.

The means for injecting photons into the first junction region may comprise a second pn junction as hereinbefore described; but reverse biased to beyond avalanche breakdown.

Thus, in the said another embodiment, the device is controlled by an electrical signal applied to the reverse biased second junction region, and which signal is converted into on optical control signal, causing injected photons to control the light emission by the first junction region. The photons may also originate from an external optical source.

The intensity of the optical output signal is a function of the electrical signals applied to the control terminals, the distance of the second or injection junctions from the first junction and the spatial placement of the injection junctions relative to the said first junction.

A control gate, for example a MOS gate, may be provided between the second junction and the first junction, and the gate may overlap the metallurgical interface of the first junction so that when a voltage is applied to the gate, the breakdown voltage may be controlled as well as the spatial position of the recombination and light emitting region in the first junction region.

Alternatively or in addition, the breakdown voltage may be lowered by providing reachthrough regions in the device structure. The reachthrough regions may extend laterally and/or vertically into the structure.

A plurality of second junctions or injection junctions for generating additional carriers in the first junction may be provided on the same chip. It will be appreciated that with these second junctions separately controllable, signal mixing and processing of multi-input formation can he performed to yield an optical output signal carrying the processed information.

Similarly a plurality of first junction regions may be provided for cooperation with a single second junction region by appropriate biasing of the junctions.

The invention also extends to a method of producing all optoelectronic device. The method comprising the steps of:
providing in contact with a suitably doped layer of an indirect bandgap semiconductor material a second layer of a conductive material or an oppositely doped layer of the indirect bandgap semiconductor material, to form a junction region;
visibly exposing the second layer;
providing electrical contacts to enable reverse biasing of the junction region;
so that when the junction region is reverse biased, in use, the device acts as an optoelectronic device.

The invention further extends to an optoelectronic device as hereinbefore defined monolithically integrated in a chip of indirect bandgap semiconductor material, together with other electronic components.

BRIEF DESCRIPTION OF THE ACCOMPANYING DIAGRAMS

The invention will now further be described, by way of example only, with reference to the accompanying diagrams wherein:

FIG. 20 is d diagrammatic representation illustrating signal mixing and processing with a multi-terminal optoelectronic device according to the invention.

DESCRIPTION OF PREFERRED EMBODIMENT OF THE INVENTION

Figure 1:
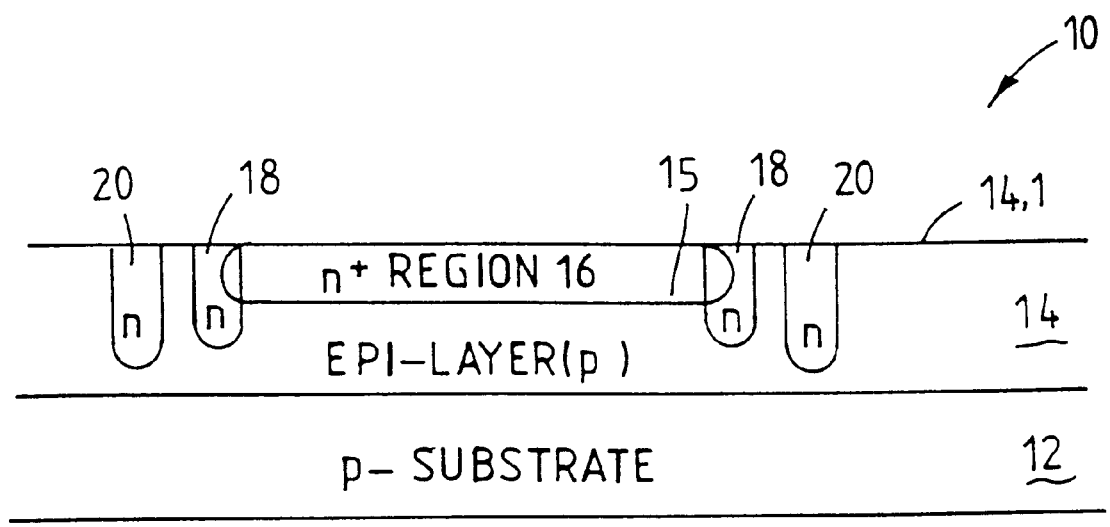
FIG. 1 is a diagrammatic sectional view of a first embodiment of the device according to the invention.
Figure 2:
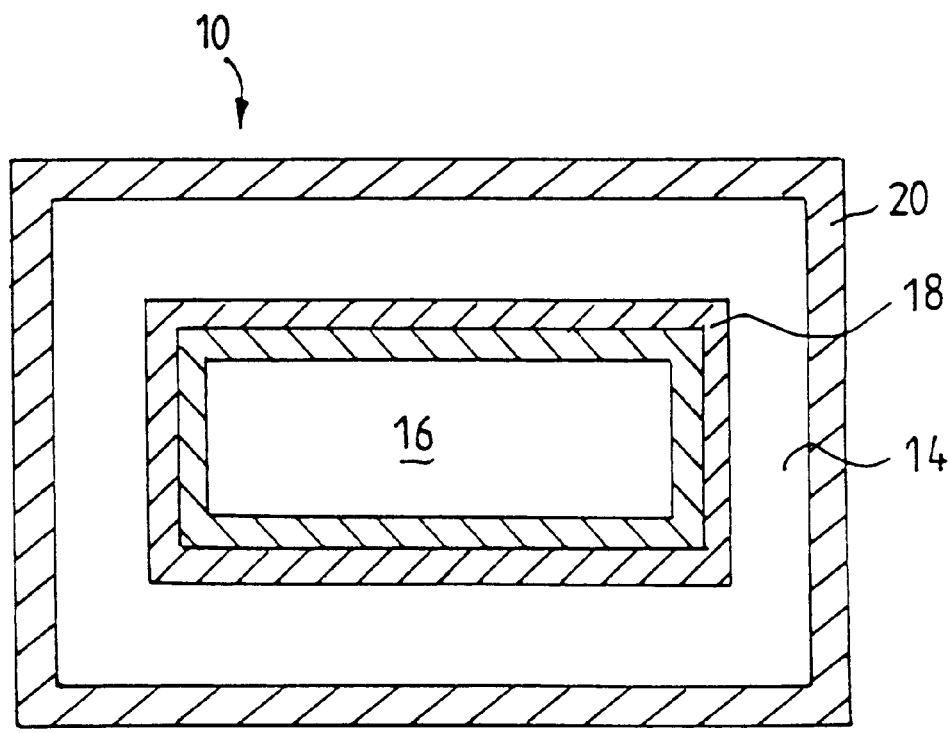
FIG. 2 is a plan view of the device in FIG. 1.

An optoelectronic device according to the invention is generally designated by the reference numeral 10 in FIGS. 1 and 2.

The device 10 comprises a substrate 12 in the form of a standard single crystal silicon water. A p-type epitaxial layer 14 is provided on substrate 12. A highly and oppositely doped planar and continuous region 16 is fabricated by means of ion implantation end detect curing in a region towards the surface 14.1 of the epitaxial layer facing away from the substrate. The region 16 and the epitaxial layer meet in a metallurgical interface or a junction region 15.

A guard ring structure 18 is provided in the junction region 15 along the sides of the region 16 to circumscribe the region 16. The guard ring structure 18 has a smaller doping concentration than the region 16 and extends deeper into the epitaxial layer 14.

An isolation ring 20 is also provided about the region 16, but spaced laterally outwardly from the guard ring 18. The isolation ring 20 also has a smaller doping concentration than the region 16 and extends deeper into the epitaxial layer 14 than both region 16 and the guard ring structure 18. The purpose of the isolation ring is electrically to isolate the region 16 from adjacent device (not shown) integrated with the device 10 on the same chip. By reverse biasing the isolation ring 20 it acts as a collector of minority carriers (electrons in FIG. 1), thus preventing minority carriers originating from adjacent devices to reach the junction region 15, or minority carriers from junction region 15 to reach adjacent devices.

Appropriate electrical contacts (not shown) are provided in known manner to reverse bias the junction region 15. This may be accomplished by means of standard metal feed tracks on field oxide on the top surface 14.1 of the structure and with one large metallized layer on the opposite face of the structure, or, ohmic contacts to the epitaxial layer 14.

The device 10 may be realised by means of virtually all standard integrated circuit technologies presently used. If, however, the device is produced using CMOS technology, which is presently the most common fabrication technology, the device can be integrated with other devices without significant adaptations to the standard methods and procedures. In other embodiments the device may be fabricated monolithically on a chip and utilised as a discrete device.

When appropriate voltage potentials are placed on the aforementioned electrical contacts, so that the $n^+p$ junction 15 is reverse biased, a depletion region is formed at the $n^-p$ junction 15. Minority carrier drift from the $n^+$ and p-epilayer sides through this region and absorb large amounts of energy from the electrical field. These carriers subsequently multiply through avalanche multiplication precesses in the depletion region and create large densities of excess electron hole pairs. It is believed that a series of highly energised conductive paths are formed in the depletion region in which the excess electrons and holes recombine and cause light radiative processes. It is further believed that the exact region of light generation is more towards the p-epilayer side of the metallurgical junction 15, in a region where both the electron and hole concentrations are equally high and the probability of high energy radiative process are the most probable. Since structural defects are important nucleating agents for minority carriers and the initial drift processes, it is important that the defect density in both the $n^+$ layer 16 as well as the p-epilayer 14 region are as uniformly distributed as possible. The purpose of the lower doped guard ring structure 18 on the periphery of the planar region 16, is to prevent preferential and localised breakdown and emission on the periphery of the $n^+$ region 16 and to enforce an even avalanche breakdown across the bottom, planar $n^+$p-epilayer interface 15. Special fabrication measures have to be taken so that the $n^+$ light emitting region 16 is either directly exposed to free air, or if passivation is necessary, the passivation layer material and thickness are chosen to ensure optimum emission from the light generation zones to the external environment beyond the surface 14.1. To achieve a shallow $n^-p$ junction 15 with a high electric field in the deletion region, use should be made of a very shallow doping profile with a steep concentration gradient of dopant impurities. This can be achieved by low energy implantation of the dopant followed by low temperature annealing (450° C.) in an inert atmosphere for a couple of hours. The defect region of the implant will be deeper than the $n^+p$ metallurgical junction and due to the low temperature anneal, the defect density will be higher than for high temperature annealing, although full electrical activation of the implanted junction is achieved. Using arsenic as dopant material will lead to a steep concentration gradient and higher electrical field in the depletion region.

Figure 3:
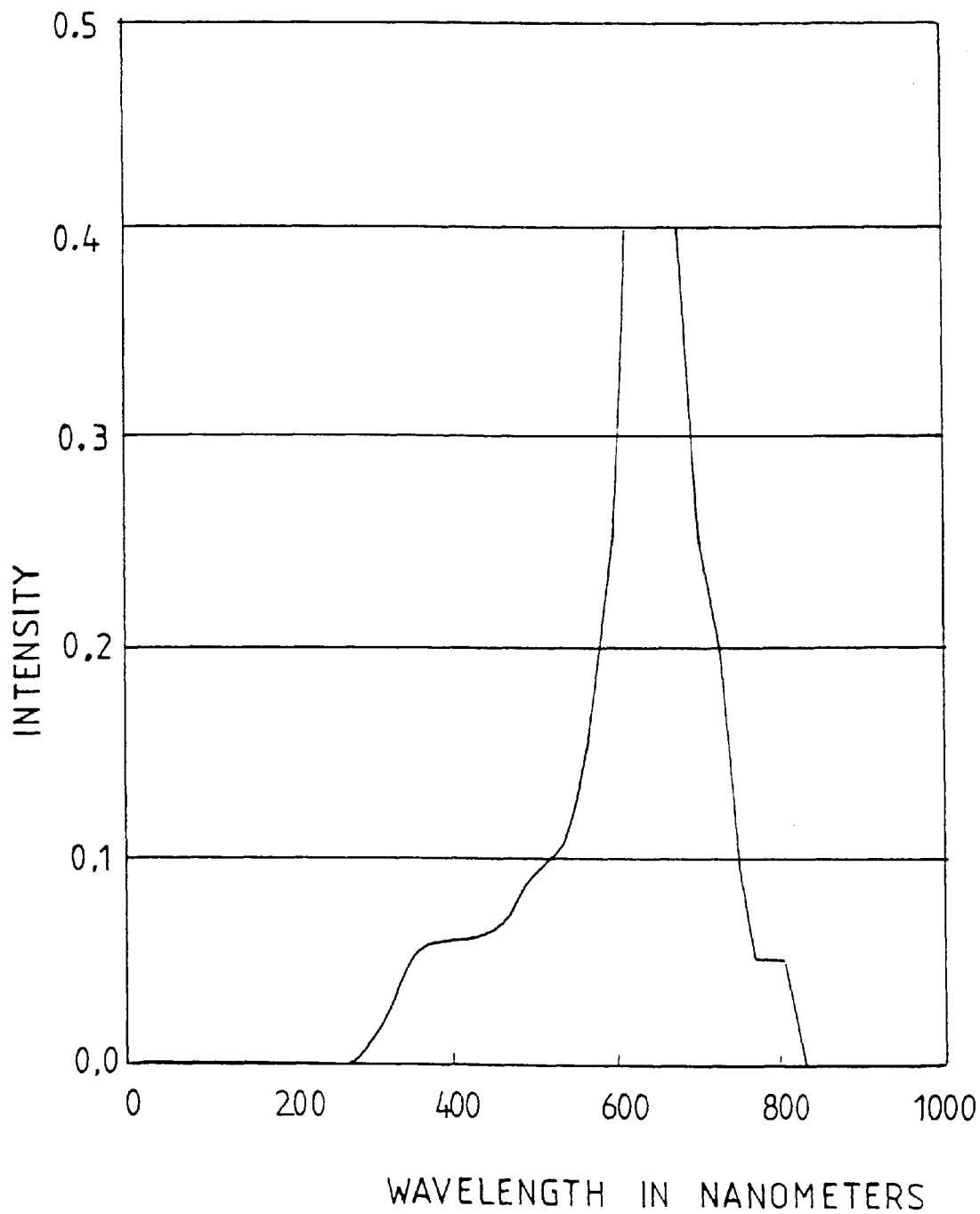
FIG. 3 is a graph illustrating the wavelength distribution of electromagnetic radiation emitted by the device when it operates as a light emitting device.

A illustrating the wavelength distribution of light emitted by the device 10 when it operates as a light emitting device, is shown in FIG. 3.

It will be appreciated by those skilled in the art that the device can also be realised using opposite and complementary doping levels for realising a $p^+$ on n-based structure.

The planar $n^-p$ light emitting interface 15 may have any suitable shape. For example, it may be circular to be compatible with an external optical fibre (not shown).

Figure 4:
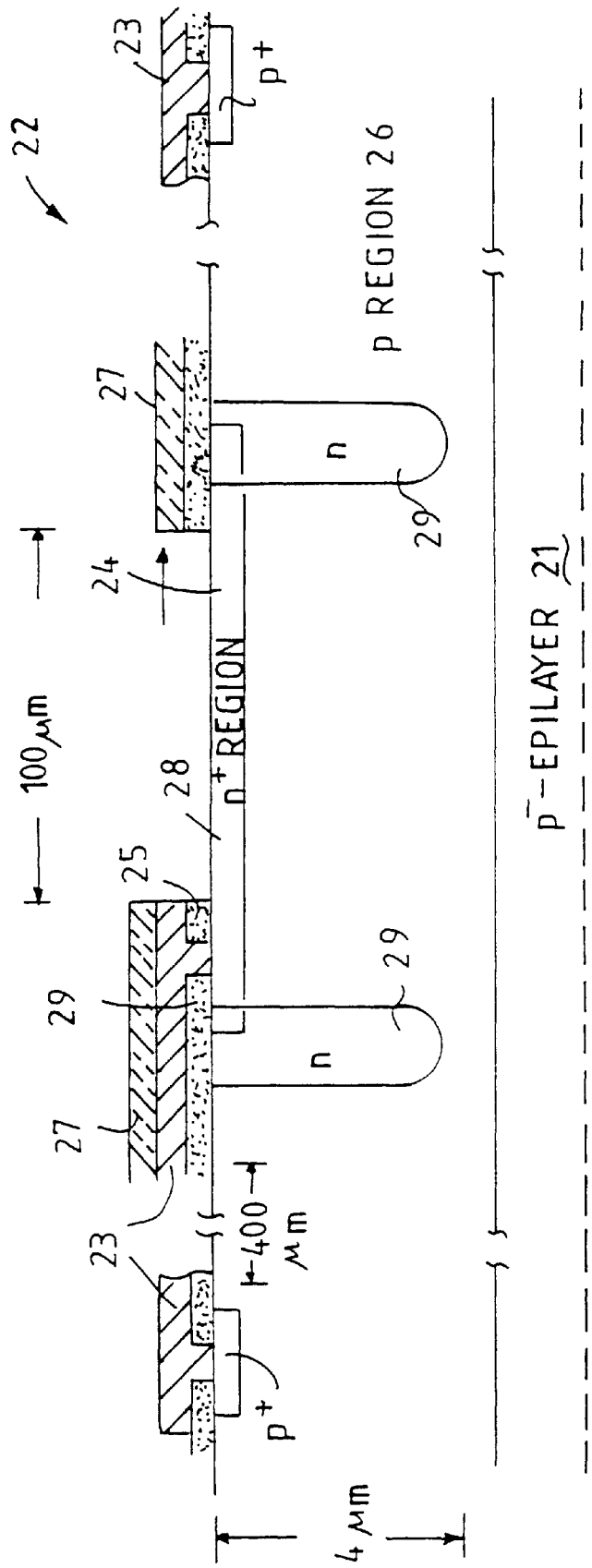
FIG. 4 is a diagrammatic sectional view of a second embodiment of the device according to the invention.

In FIG. 4 there is shown a second embodiment 22 of the device according to the invention. The device comprises a 0.3 $\mu$m thick $n^-$ layer 24 embedded in a p-substrate 26 with light emitting from the depletion region about the $n^{30}$ p interface 28. The metal voltage/current feed layers 23, field oxide layers 25 and glass passivation layers 27 are well known in the art and do not require further description.

The device can be realised by using the FORESIGHT 1.2 micron double poly double metal n-well and p-well CMOS process of Orbit Semiconductor Inc. The following design procedures or building principles can be used as building blocks for realising the device:

using a silicon epitaxial layer on a Czochralski or float zone grown wafer as a substrate 21;

using the p-well definition of the above process for providing a p-type epitaxial layer 26 for the structure. The doping concentration is typically in the order of $7\times10^{15}$ cm$^{-3}$;

using the normal MOSFET n-active region definition for providing the $n^-$ region 24 of the structure. The doping concentration is typically in the order of $2\times10^{19}$ cm$^{-3}$;

using the n-well definition for providing the guard ring structure 29. The doping concentration is in the order of $2\times10^{16}$ cm$^{-3}$;

using the field oxide definition to ensure electrical insulation 25 of the metal trucks 23 from the surface:

using the so-called "metal 1" definition for providing the metal tracks 23 to the region 24 and to the $p^+$ contacts to region 26;

using the contact hole definition to provide a hole 29 through the field oxide to the upper face of region 24 to permit contact between the track 23 and the region 24 and to the $p^+$ contacts to region 26;

using the glass passivation mask definition and placing it over region 24 in order to facilitate etching of the final surface passivation layer 27 over the region 24, thereby to leave the region 24 exposed.

The density of current filaments at the junction 28 can be increased by using processing procedures that would increase the defect state density present in the $n^+$ layer 24.

This can typically be done by reducing the defect curing annealing time after ion implantation. During strong reverse bias of the junction, the leakage current through the $n^+p$ junction 28 can be substantially increased by the extra defect states so created. These defects act as sources for higher densities of excited minority carriers, consequently increasing the leakage current through the junction 28 during reverse bias and consequently also substantially increasing the density of plasma conduction current filaments during junction breakdown. The higher density of current filaments drastically increases the light generation from the junction 28.

Uniformity in optical emission from the junction 28 can be increased by using a more structural defect free p-substrate 26. This phenomenon can be explained by means of hot carrier recombination and photon emission which favour shorter wavelength emission in a more intra band state free semiconductor when minority carriers drift from the $n^-$ layer 24 through the depletion layer to the substrate 26. Any defect states present in the drift region after minority carrier generation will result in multiple transitions from the conduction band via defect state energy to valence band with the result of a successive longer (not visible radiation) emissions from the junction. A defect free crystal in the drift region of the minority carrier results in higher energy transitions from conduction to balance band with shorter wavelength emissions in the visible part of the electromagnetic spectrum.

Figure 5:
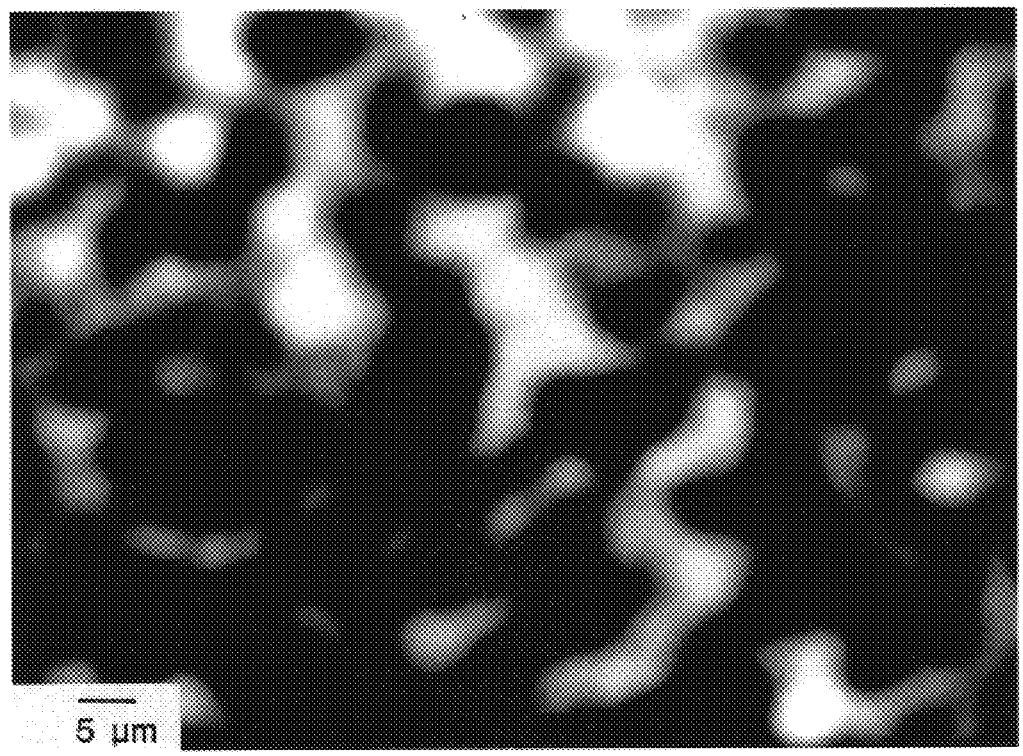
FIG. 5 is a SEM-ERIC image showing leakage current in the depletion region before avalanche breakdown.
Figure 6:
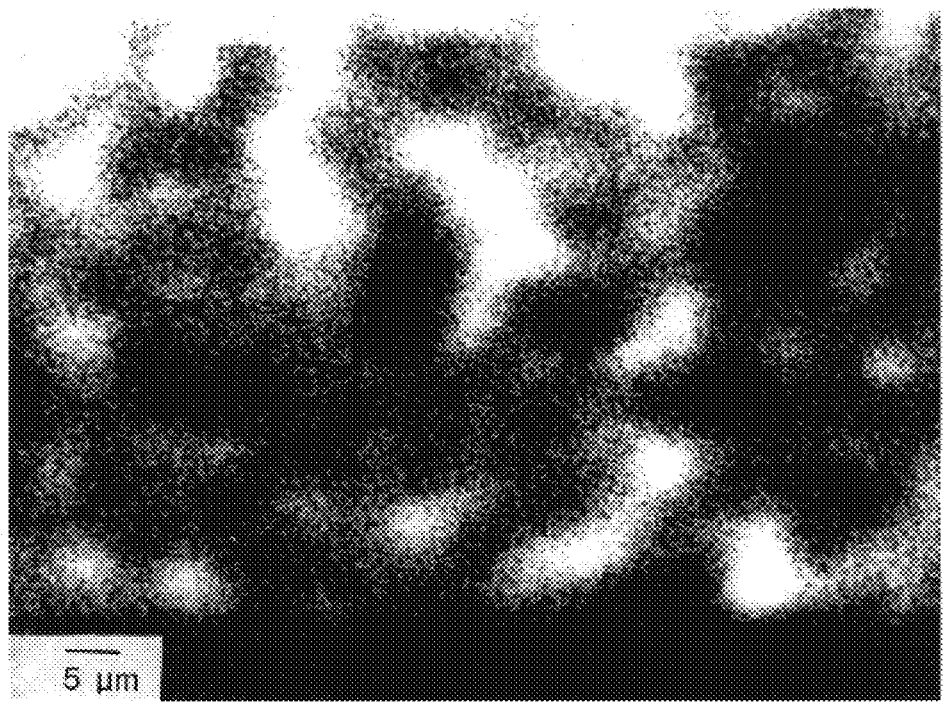
FIG. 6 is a similar image showing large densities of current filaments in the depletion region at avalanche breakdown.

In FIG. 5 there is shown a SEM-EBIC image of leakage current in the junction region 28 before avalanche breakdown. In FIG. 6 a similar image is shown for after breakdown. The white regions depict higher current regions and higher light emission intensity.

Figure 7:
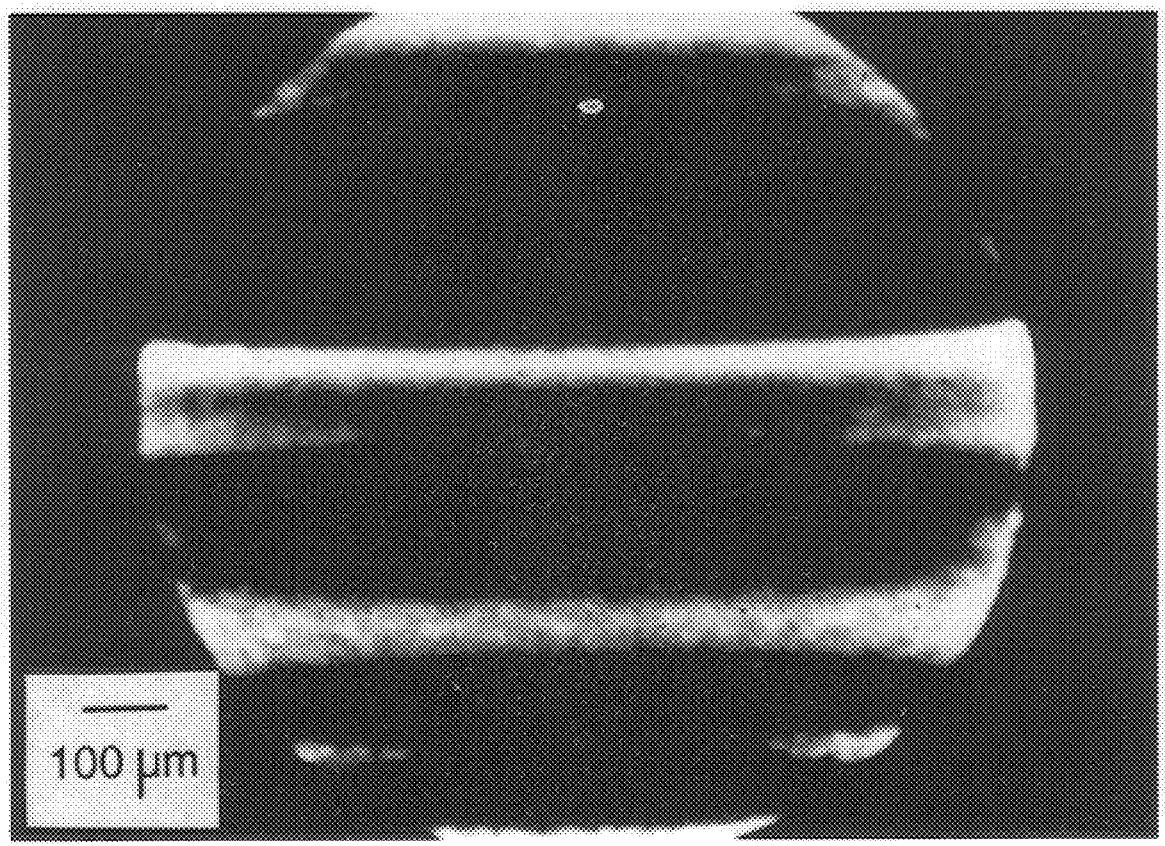
FIG. 7 is a micrograph of the light emission from a device as shown in figure 4 fabricated with $n^-$ ion implantation on a p ion implanted non-epitaxial substrate.
Figure 8:
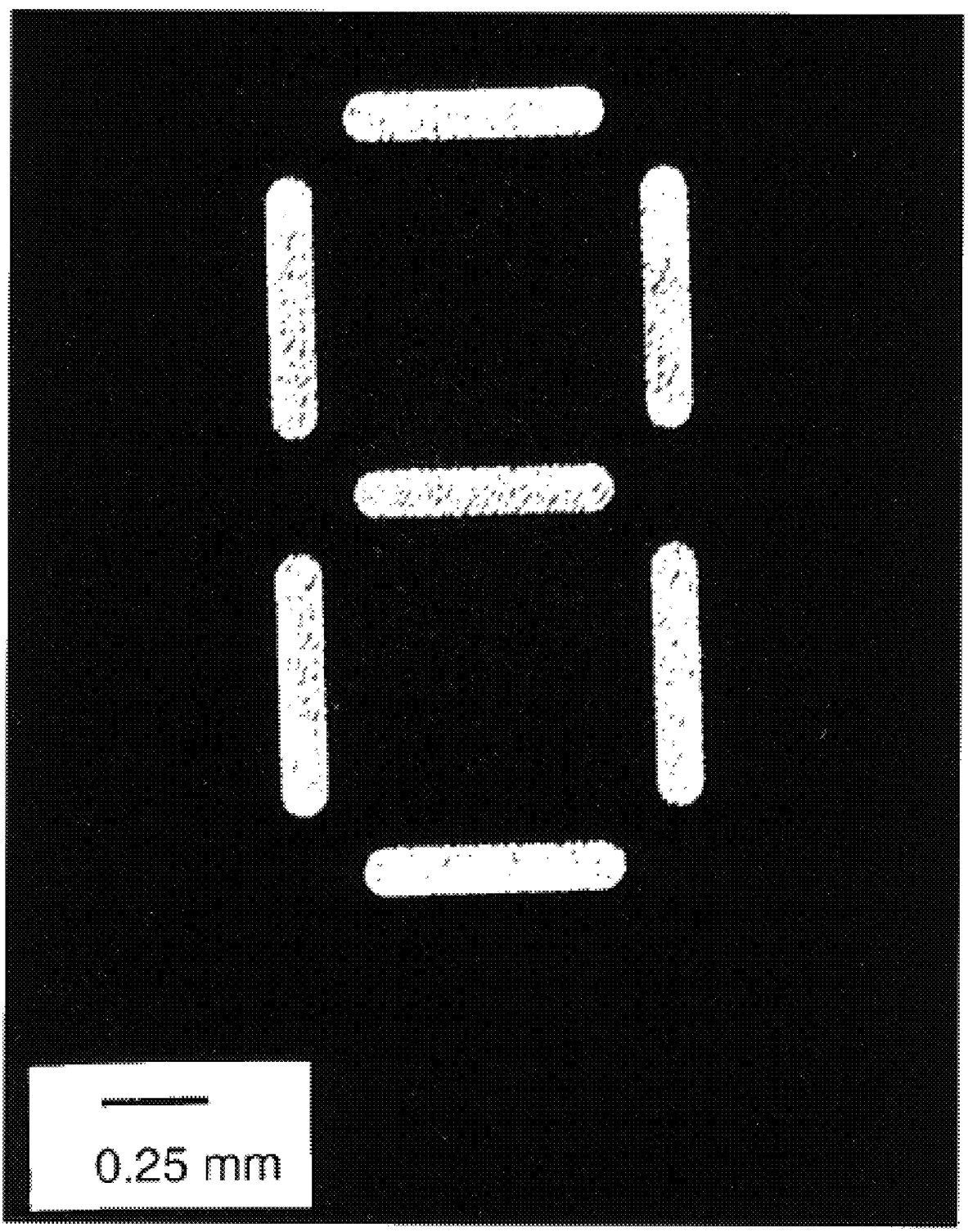
FIG. 8 is an illustration of the light intensity distribution when the device is fabricated utilising a more structural defect free p-epilayer substrate.

In FIG. 7 there is shown a photograph of light emission distribution from a device fabricated with $n^+$ ion implantation on a p ion implanted substrate with no epitaxial layer. When comparing this photograph to that shown in FIG. 8, clearly better uniformity and higher light emission are achieved with a more structural defect free p-epilayer which produced the light shown in FIG. 8. The area of the light emitting surface in FIG. 7 is 0.64 mm$^2$ and the current is 70 mA. In the case of the photograph in FIG. 8 the area is 0.35 mm$^2$ and the current is 20 mA.

Figure 9:
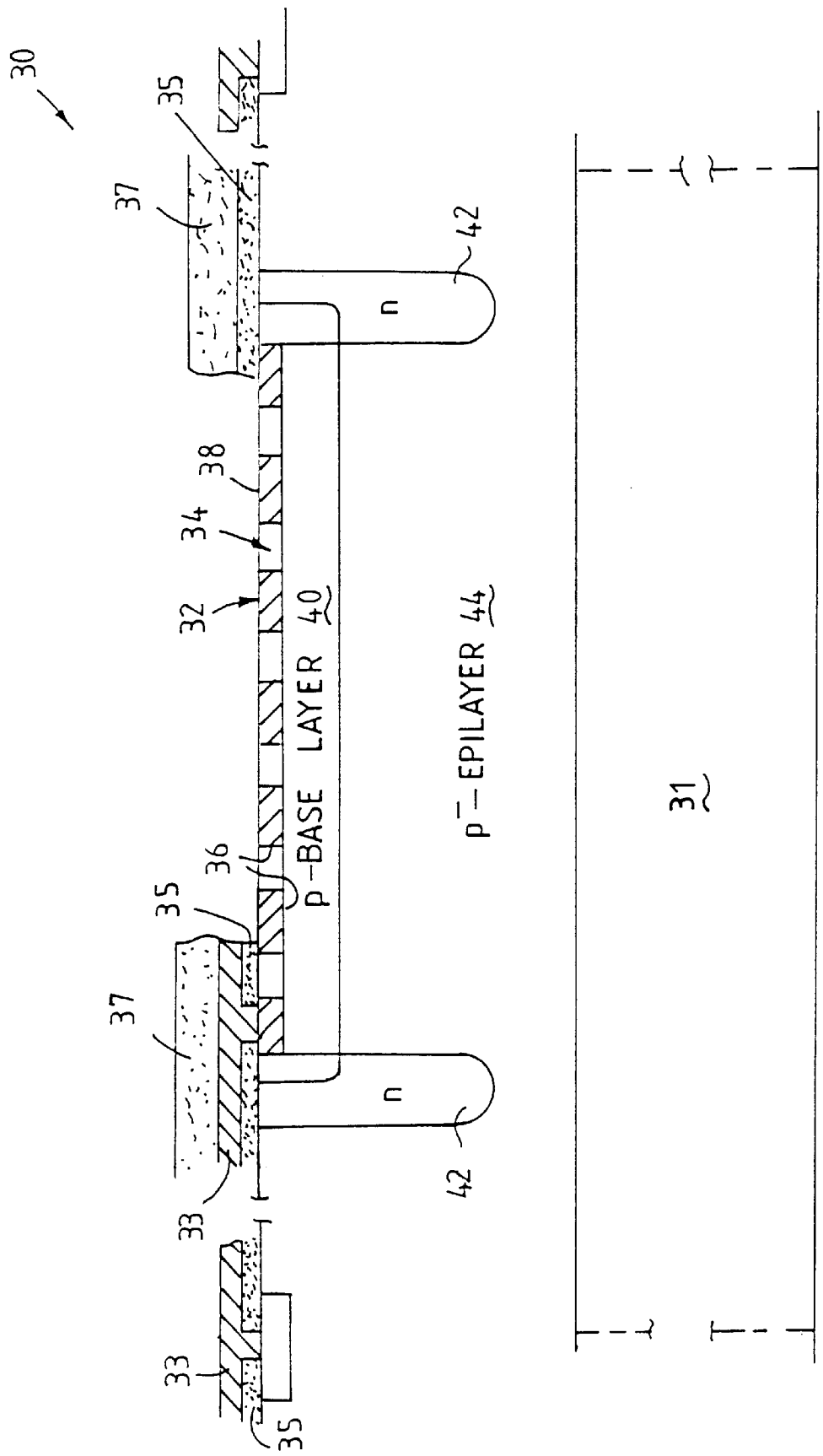
FIG. 9 is a diagrammatic sectional view of a third embodiment of the device according to the invention.

In FIG. 9 there is shown a third embodiment of the device according to the invention designated 30. Also in this case the substrate 31, metal voltage/current feed layers 33, field oxide layers 35 and glass passivation layers 37 are well known in the art.

The heavily doped $n^{30}$ region 32 of this device is in the form of a grid 34. Accordingly, the surface area of the $n^+p$ junction region 36 has been increased compared to that of the embodiments hereinbefore described. Furthermore, the distance from the $n^+p$ junction 36 to the surface 38 of the device has been reduced, resulting in less optical absorption in the near surface regions and thus increased emission of generated light.

The $n^+$ region 32 is embedded in a higher doped p ion implanted base layer 40 than the $p^-$ epilayer 44 in order to reduce the avalanche breakdown voltage and thus to induce light emission at a lower operating voltage.

The n-well guard rings 42 prevent light emission from the lateral peripheral regions of the $n^+$ region 32 and facilitate uniform distribution of electric field at the $n^+p$ junction across the grid 34.

It has been found that a typical device according to the third embodiment operates at about 7.5V which is compatible with general CMOS maximum operating voltages which vary between 9 to 15V. The device tested yielded 1 nW visible light over a 65 micron diameter circle at 7.5 volt and 10 mA.

Figure 10:
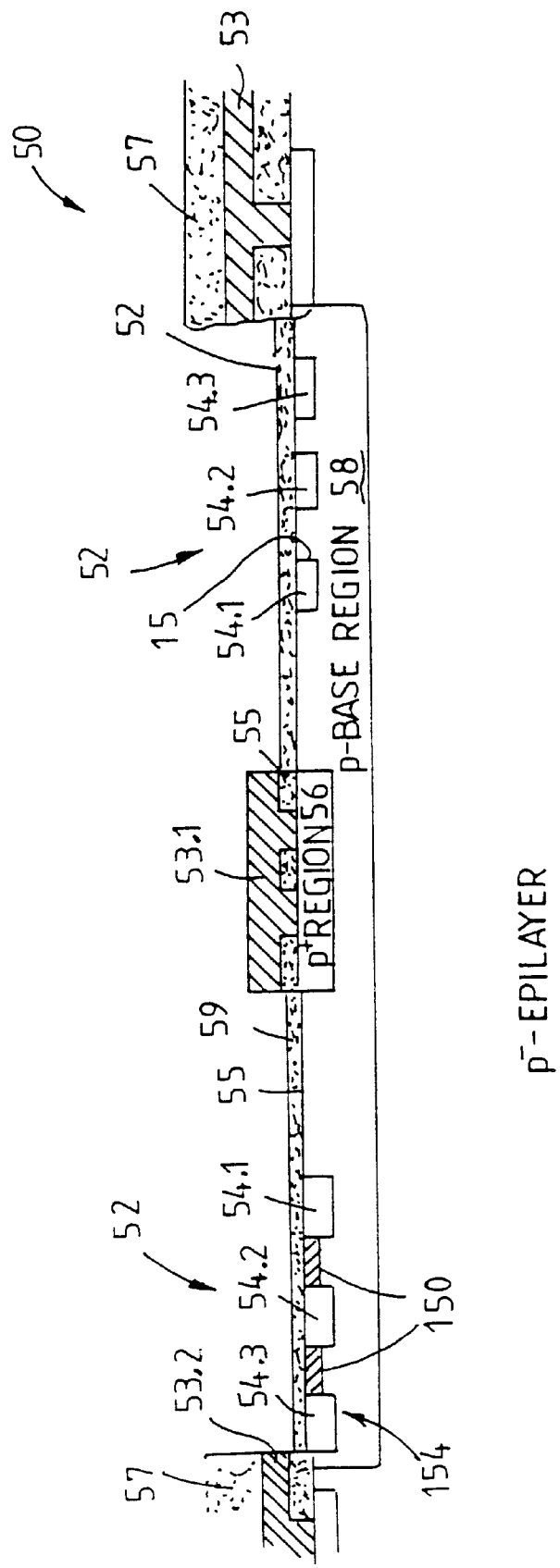
FIG. 10 is a diagrammatic sectional view of a fourth embodiment of the device according to the invention.

In FIG. 10 there is shown a fourth embodiment of the device according to the invention designated 50. Also in this case the structure and function of the substrate 51, metal voltage/current feed layers 53.1 and 53.2 field oxide passivation layers 55 and glass passivation layers 57 are well known in the art.

The $n^+$ region 52 of this device comprises a plurality of radially spaced concentric rings 54.1, 54.2 and 54.3. At the origin of the circle there is provided a $p^+$ region 56. The rings 54.1 to 54.3 and $p^+$ region 56 are embedded in a p-base region 58, to lower the avalanche breakdown voltage and accordingly the operating voltage of the device. The rings 54.1 to 54.3 art inter-connected by $n^+$ regions 150 causing a potential gradient from the inner to outer $n^+$ concentric rings when breakage has occurred. The p-base region is embedded in a $p^-$ epitaxial layer 152.

The placement of the $n^-$ and $p^-$ regions designated 52 and 56 respectively and the geometrical layout of these regions in specific radial configurations with respect to each other are chosen such that potential gradients on both the current feeding $n^-$ regions and current feeding $p^-$-p substrate regions are minimised. If appropriately designed with correct respective doping levels of the various regions, it would ensure a non-preferential and even onset of avalanche multiplication and light emission over the whole of the $n^+$ region 52, or with preferential onset of breakdown at the $n^-$ regions nearest in the centre 56, but easily spreading radially outwards to the outer $n^+$ rings.

The overall effect of this structure is to create plasma conduction current and light generating filaments parallel to the device surface 59 with current filaments generated right up to the surface 59 of the device. This minimizes the absorption of the optical photons in the surface region and ensures the maximum possible emission of light from the device. The device therefore operate on a surface breakdown mechanism 154.

A typical device according to the aforementioned fourth embodiment has been tested to yield about 10 nW of optical power over a 20 $\mu$m diameter circular area at 4.5V and 10 mA.

Figure 11:
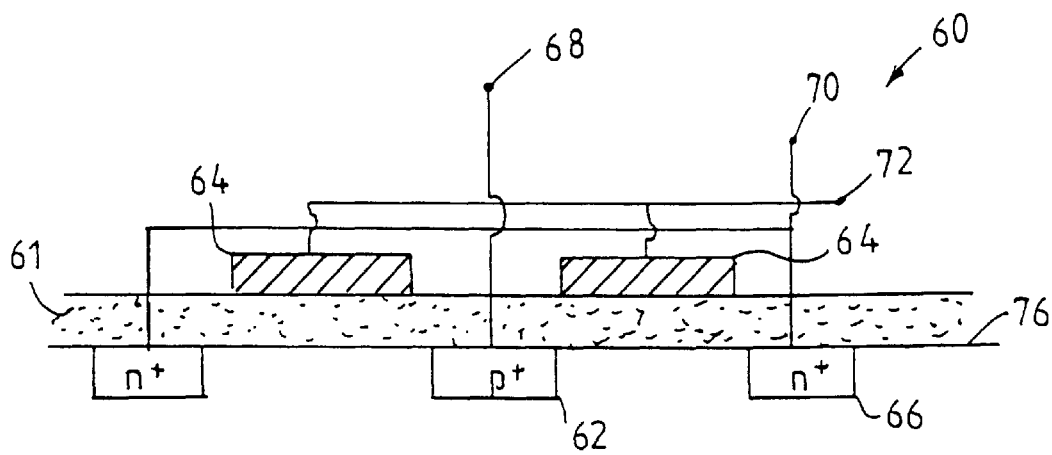
FIG. 11 is a diagrammatic sectional view of a fifth embodiment of the device according to the invention.
Figure 12:
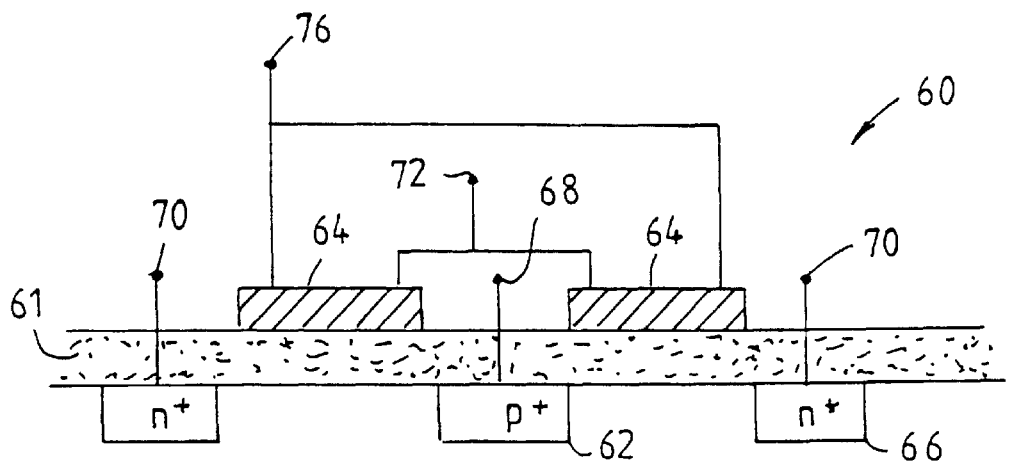
FIG. 12 is a view similar to FIG. 11 wherein the gate is a resistive gate.

In FIG. 11 and 12 there is shown a fifth embodiment of the device according to the invention and which is designated 60.

The device is similar to the fourth embodiment shown in FIG. 10, but further comprises a controllable circular conductive gate 64 between the centre $p^-$ region 62 and the concentric $n^+$ circles 66. The gate is located on an oxide layer 61.

Referring firstly to FIG. 11, with the $n^+$ and $p^+$ regions (designated 66 and 62 respectively) reverse biased via terminals 70 and 68, and with a positive voltage applied to terminal 72, majority carriers from the substrate 74 are attracted towards the surface 76, to increase the doping level of the surface region between the $n^+$ and $p^+$ regions. This results in a lowering of the avalanche breakdown voltage. Since the gate electrodes 64 induce surface inversion, depletion or accumulation only and draw no current, they may be used as controlling terminals for switching on the light emission between the $n^+$ and $p^+$ regions. By application of an appropriate voltage to the gates 64, the magnitude of avalanche current and light emission can be controlled enabling analogue amplification possibilities of signals.

The gate 64 may be made of a transparent conductive material, such as indium tin oxide.

As shown in FIG. 12, an additional contact 76 may be provided on the gates 64 to form resistive gates extending in a radially outward direction. Voltage profiles may thus be generated in the gates in a radial direction, enabling and facilitating control of the uniformity of the light emission and furthermore, the spatial location of the emission may to shifted in a lateral direction.

Figure 13:
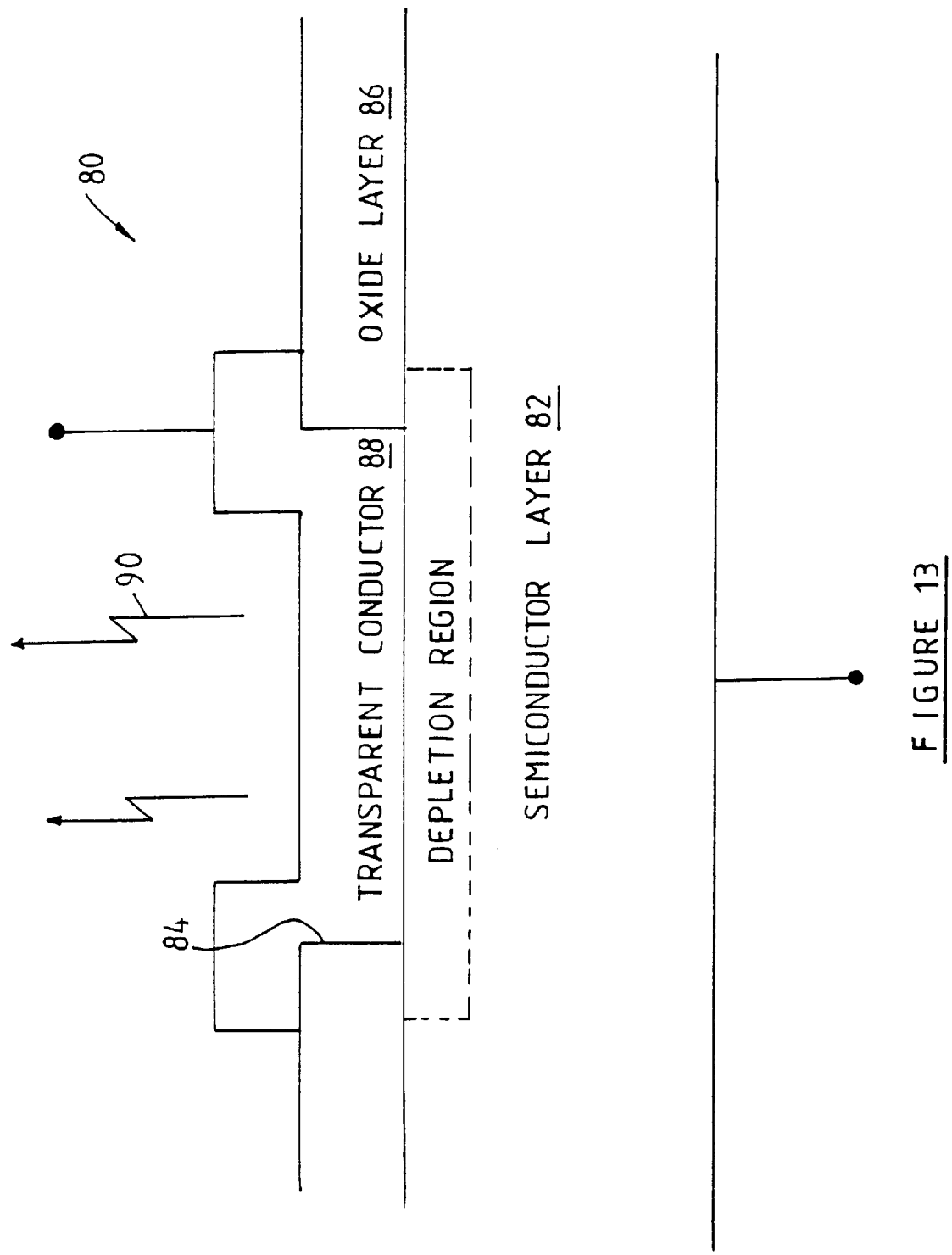
FIG. 13 is a sectional representation of a sixth embodiment in the form of a Schottky-type configuration falling within the scope of the present invention.

In FIG. 13 there is shown another light emitting device 80 failing within the scope of the present invention.

The device 80 has a Schottky-type structure and comprises a lightly doped indirect bandgap semiconductor layer 82. In a window 84 defined in an oxide layer 86, there is provided a transparent conductor 88. When the junction between transparent conductor 88 and semiconductor 82 is reverse biased to beyond avalanche breakdown, light is transmitted through the transparent conductor 88 and beyond the transparent conductor as shown at 90.

Figure 14:
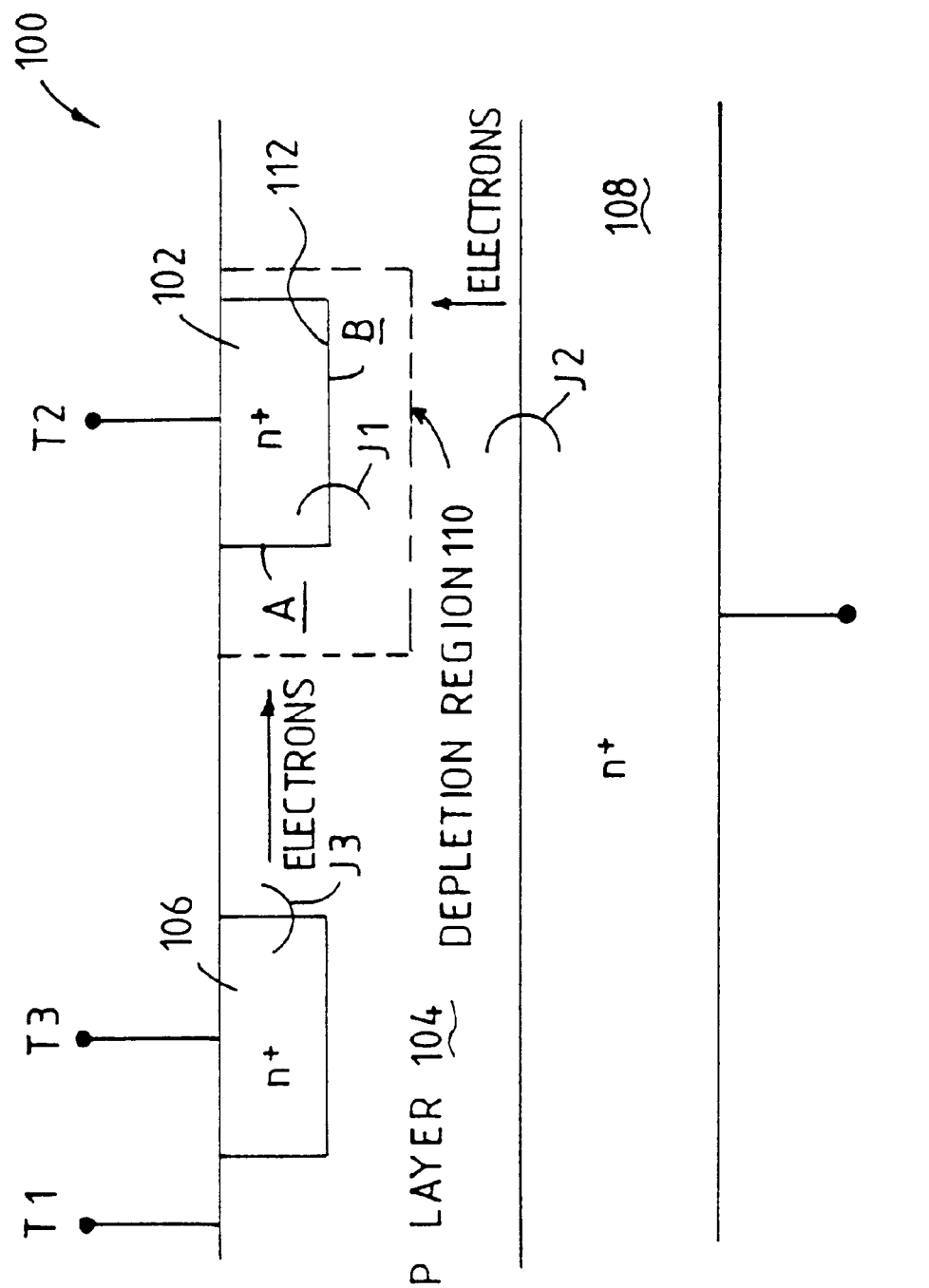
FIG. 14 is a sectional representation of a first embodiment of a multi-terminal optoelectronic device according to the invention.

A diagrammatic representation of a multi-terminal device according to the invention is generally designated by the reference numeral 100 in FIG. 14.

The device 100 comprises a first highly doped $n^+$ silicon region 102 embedded in a p-type epitaxial layer 104. Also embedded in layer 104 is a second $n^+$ region 106. The epitaxial layer 104 is located on a $n^+$ substrate 108. Terminal 11 is connected in known manner to layer 104, terminal T2 is connected to first $n^+$ region 102, terminal T3 is connected to second $n^+$ region 106 and terminal T4 is connected to substrate 108.

In use, the junction J1 between first $n^+$ region 102 and epitaxial layer 104 is reverse biased to beyond avalanche breakdown via terminals T1 and T2, so that a depiction region 110 is formed about the metallurgical interface 112. Second junctions J2 and J3 are forward biased via terminals T1, T3 and T4.

The forward biased second junctions J2 and J3 inject minority carriers (electrons) into the first junction J1. With the junctions J2 and J3 located within approximately one minority carrier diffusion length from the depletion region 110, the injected electrons are swept into the high field region of the first junction J1 where they multiply. The advantage of this arrangement is that the source of carriers causing light emission is not limited to the small reverse current associated with the first junction region J1, but is much larger due to the carriers injected into the first junction region J1 by forward biased injection junctions J2 and J3.

Junctions J2 and J3 are electronically controllable via their terminals so that electronic signal modulation of the optical output signal is possible.

Junction J3 stimulates light emission from the surface area along the perimetry of junction J1. This area is marked A in FIG. 14. Junction J2 stimulates light emission from a region marked B in FIG. 14, which is deeper into the bulk material. Junction J2 causes light to be emitted in a spatial pattern similar to the overlapping areas of J1 and J2. For a circular layout of J1, a circular filled light pattern is emitted external. Junction J3 causes light to be emitted from that peripheral region of J1 facing the junction J3. If, for example, J3 completely surrounds J1, the light pattern emitted externally would be in the shape of a doughnut or ring.

The spectral content of the two light emission patterns as controlled by J2 and J3 may also differ. Region A is closer to the surface of the device 100 and emission from this region therefore contains more short wavelengths than the light controlled by J2. Due to the deeper region B, the shorter wavelengths will be absorbed in the bulk material before reaching the surface. In this way the spectral and the spatial characteristics of the emitted light by the device can be controlled by controlling junctions J2 and J3. The spectral content of the emitted light can thus electronically be varied without the use of optical filters. The forward biased currents passing through the junctions J2 and J3 modulate the light intensity of emission from junction J1, but the intensity of emission may also be varied by the distance between injection junctions J2 and J3 respectively and emitting junction J1, as well as the spatial layout of junction perimeters (J3 relative to J1) and areas (J1 relative to J2).

By using more than one controlling junction J2 and J3, the light being emitted from J1 can be modulated by more than one electrical input signal, thus facilitating mixing of signals and the performing of logical functions.

Figure 15:
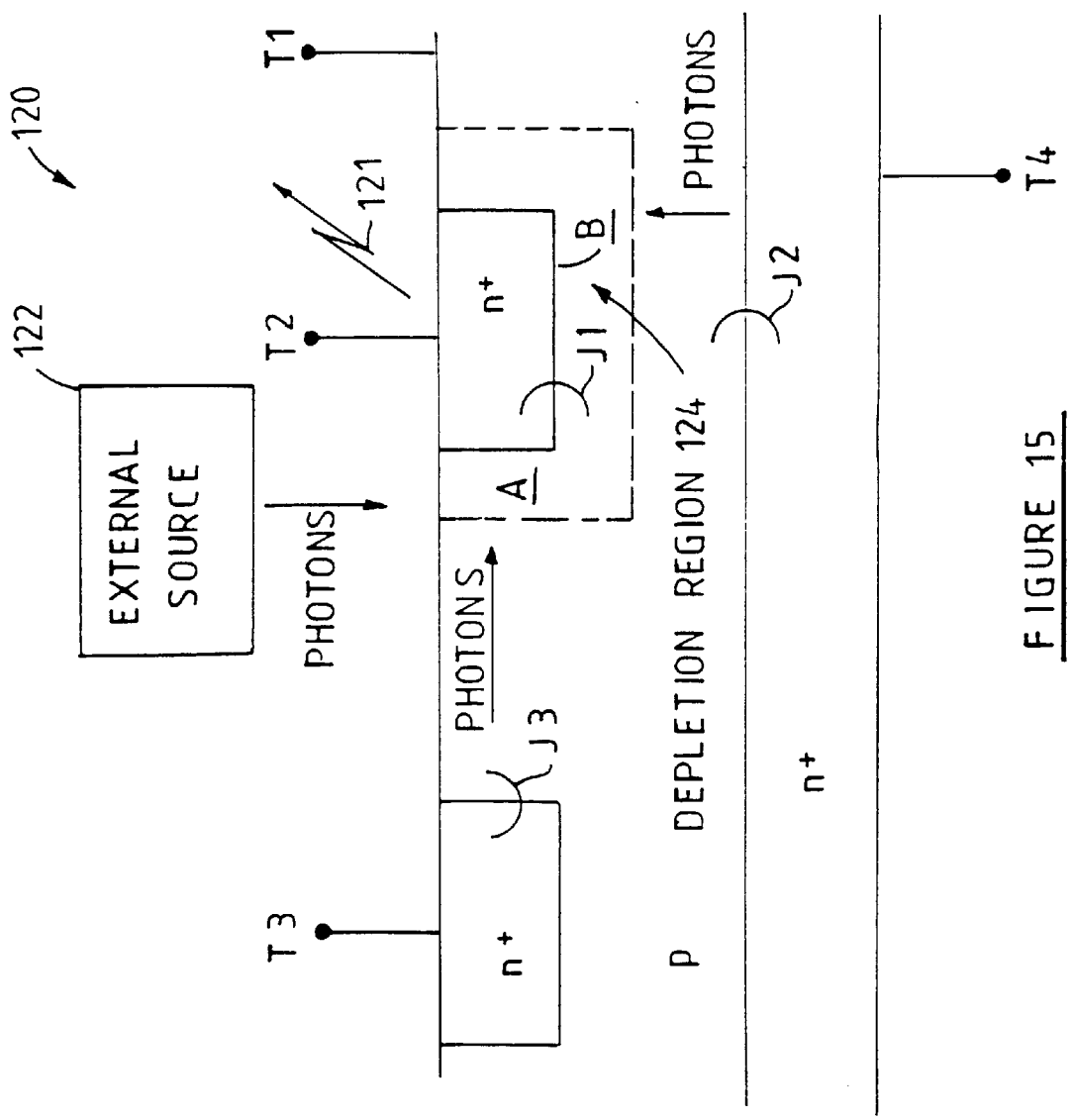
FIG. 15 is a similar view of a second embodiment of the multi-terminal device.

In FIG. 15, there is shown a diagrammatic representation of a second embodiment of the multi-terminal device according to the invention designated 120. The general structure of the device 120 is similar to that of the first embodiment 100 described with reference to FIG. 14. The main difference is that the junctions J2 and J3 are reversed biased via terminals T1, T3 and T4 to beyond avalanche breakdown, so that light or photons are emitted by junctions J2 and J3. The photons from these sources are absorbed in junction J1 and electron-hole pairs are generated in junction J1. These photon-generated carriers are multiplied in the high-field of junction J1 and eventually the carriers recombine to generate optical emission from junction J1. The optical output 121 of the multi-terminal device 120 is thus controlled by an electrical signal, which is then converted to an optical control signal, thus causing injected photons to control the light emission. The photons may also originate from an external optical source 122, thus facilitating the photonic control of the light emission process.

Under reverse bias conditions of junctions J2 and J3 photons are injected from the junctions J2 and J3 into the bulk material and will generate electron-hole pairs throughout the bulk material. Some of these photon-generated electrons diffuse to the depletion region 124 of junction J1, or will be generated within this depletion region. The injected electrons are swept into the high field region of the depletion region and multiply. The reverse biased junctions J2 and J3 thus increase the carrier densities in the recombination region of junction J1 by photonic means, thus effectively controlling the light intensity emitted from junction J1.

The spatial patterns of the emitted light and the spectral content will be very similar to that for the controlling junctions as discussed with reference to FIG. 14. The multi-terminal control options or applications like analog modulation, signal mixing and logic function operation are also similar to that referred to with reference to FIG. 14.

Figure 16:
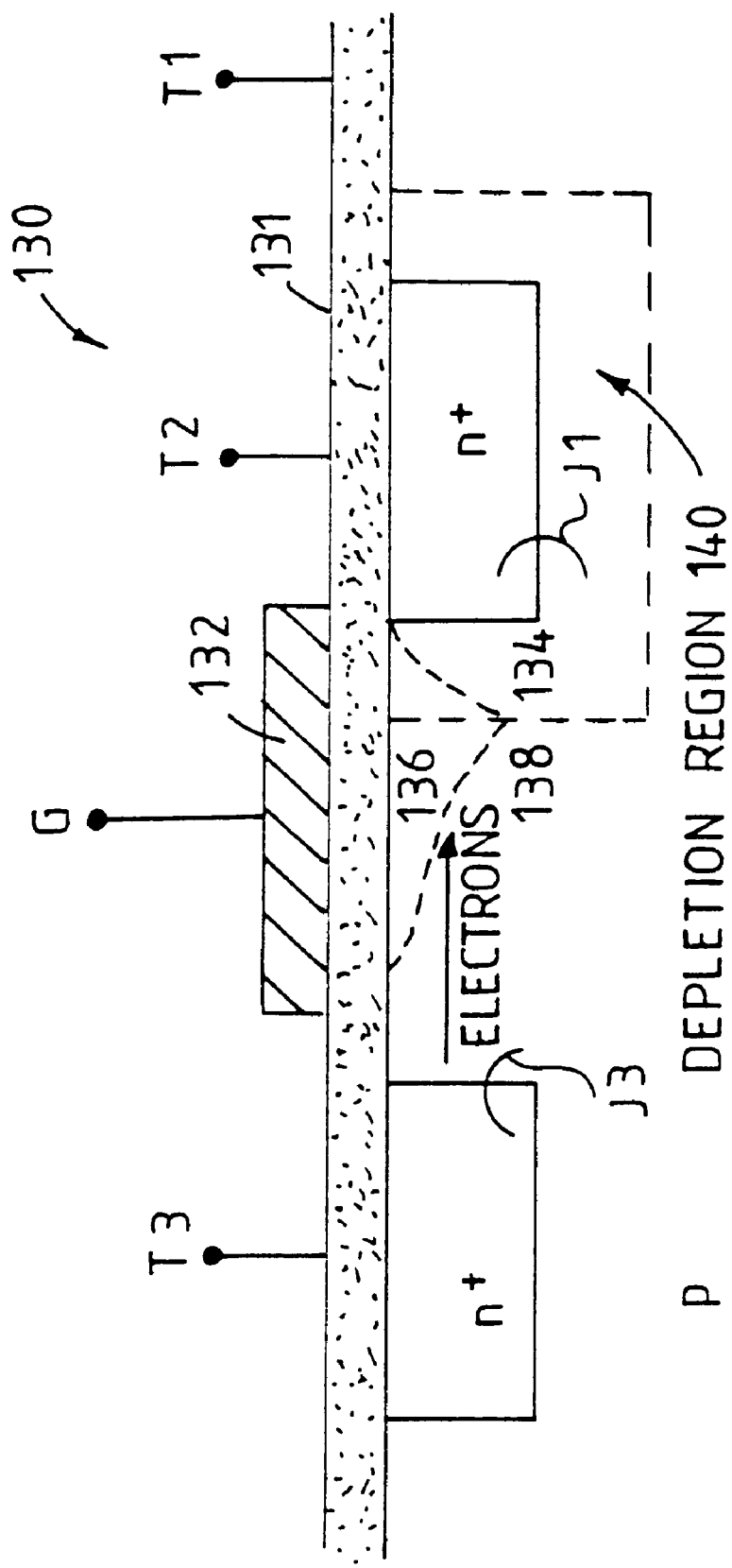
FIG. 16 is a similar view of a multi-terminal device also comprising a MOS control gate.

As shown in the diagrammatic representation in FIG. 16, the depletion region 140 of the emitting junction J1 can be modified at the surface of the device by using a MOS gate control electrode 132, as shown in respect of device 130. The gate 132 is separated from the semiconductor surface by an oxide layer 131. By varying the voltage on electrode 132, the semiconductor surface can be placed in accumulation (depletion region 134), flat band (depletion region 138) or inversion (depletion region 136). The voltage on electrode 132 can thus control the electric field in the depletion region 140 at the surface, and thereby control the breakdown voltage as well as the spatial position of the carrier multiplication region and recombination radiation region. An additional forward biased control junction J3 is also shown in FIG. 16 from where electrons are injected into the depletion region to increase carrier densities, as explained hereinbefore with reference to FIG. 14.

The gate electrode 132 may be made to overlap the control junction J3, resulting in a MOS transistor with J1 the drain and J3 the source of the transistor. In this device, the junction J3 may mow be reverse biased and when gate 132 is pulsed higher than the MOS threshold voltage, electrons are emitted from J3 into the transistor channel (at the surface of the semiconductor material beneath the gate 132) and if the channel length from J3 to J1 is short enough, avalanche multiplication due to the high electric field at the drain takes place and light will be emitted near junction J1.

Low breakdown voltages to get operating voltages of the device according to the invention compatible with existing silicon integrated circuit technology and to minimize heat generation may be achieved by using shallow junctions and using the reduced surface breakdown effect of the spherical or cylindrical junction curvature at the surface. The pn junction depletion region 140 at the surface can further be modified by using a control gate 132 (MOS structure) overlapping with the pn junction, thus varying the breakdown voltage and depletion region electric field. In the case where the emitted light has to be transmitted externally, the gate material should be manufactured from transparent conducting material, such as indium tin oxide.

Low breakdown voltage can be achieved by choosing proper doping levels, specialized structural designs and promoting preferential surface and near-surface breakdown.

Figure 17:
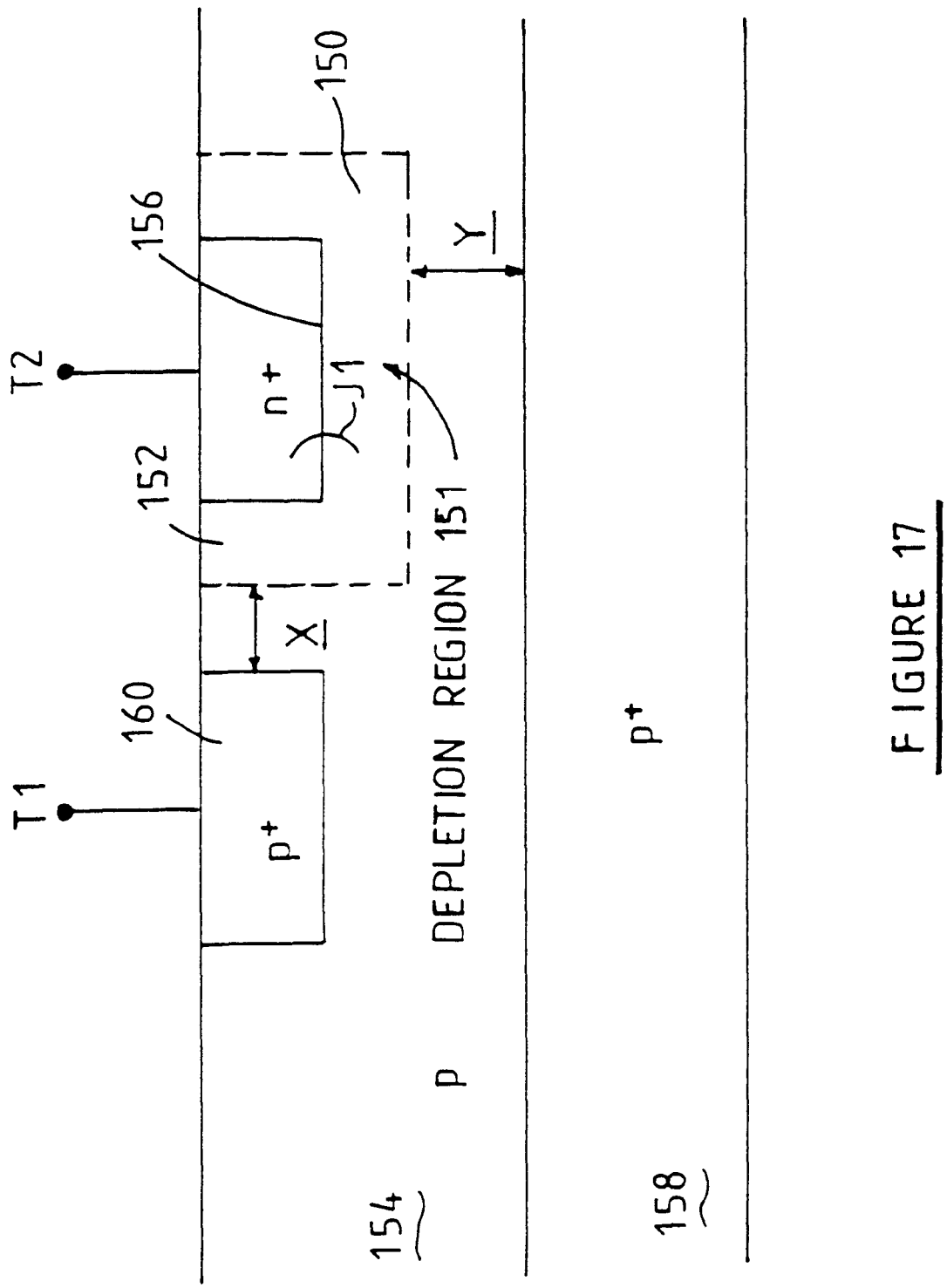
FIG. 17 is a similar view of a device according to the invention illustrating vertical and lateral reachthrough regions in the structure of the device.

As shown in FIG. 17, another way to get low breakdown voltage is to manufacture reach through structures 150 and 152 preferably in thin epitaxial layers 154 for better uniformity. These structures may be in the form of a n⁻ diffusion depletion region 61 reaching through a p layer 154 to a p⁻ region 158. Such a reachthrough structure can be vertically integrated as shown at y or laterally integrated as shown at x in FIG. 14.

In FIG. 17, the emitting junction J1 is reverse biased and the depletion region 151 of J1 will spread into the p type material. As the voltage is increased and as soon as the depletion region reaches a highly doped p⁺ region, the electric field increases and breakdown occurs. The breakdown voltage junction of J1 will be lower by this reachthrough process. Lateral reachthrough in region x results in light generation near the surface of the device which is more suitable for externally emitting devices. Vertical reachthrough in region y results in light generation deeper in the bulk of the device which may be more useful for internally emitting devices. The breakdown voltage is a function of the distance between the n⁻ emitting junction 156 and the p⁻ regions 158 and 160, as well as a function of the doping level in the p region 154. This breakdown voltage reduction technique may be combined with other methods for lowering breakdown voltage.

Both reachthrough structures as described with reference to FIG. 17 may be used in conjunction with the electronic or photonic control injection junctions as described with reference to FIGS. 14 and 15 respectively.

Figure 18:
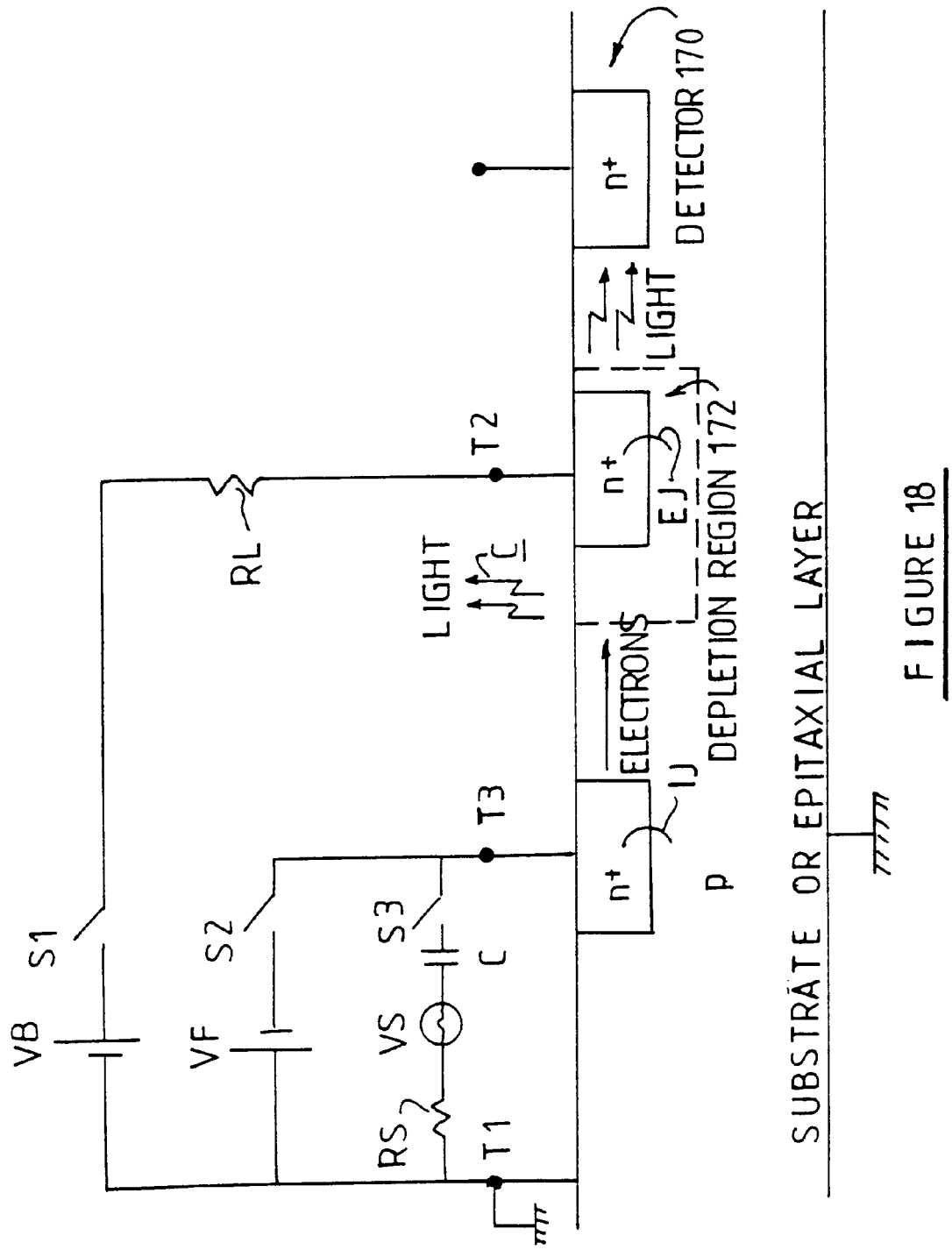
FIG. 18 is a more detailed illustration of a three terminal device according to the invention and associated circuitry utilizing lateral carrier injection to enhance light emission.

The operation of a light emitting device (LED) with lateral carrier injection can be described with reference to the diagrammatic representation in FIG. 18.

With switch $S_1$ closed and switches $S_2$ and $S_3$ open, application of reverse breakdown voltage $V_B$ between terminals T2 and T1 with the indicated polarity results in carrier multiplication of the reverse junction current components. Upon quantum transitions (recombination) of cheese carriers, light is emitted into all directions from the emitting junction EJ. In FIG. 18 only two directions C and D are indicated. The intensity and spectrum of emitted light depend upon the density of the multiplied carriers which originate from the reverse leakage current.

With switches $S_1$ and $S_2$ closed and switch $S_3$ open, application of forward bias voltage $V_F$ between terminals T3 and T1 across the injecting junction IJ causes an injection of carriers (mainly electrons in this case) from the IJ into the depletion region 172 of junction EJ, and while moving through the depletion region these carriers are multiplied as well, increasing the light generation. The amount of additional carriers and the resultant light depend on the doping levels within the semiconductor, the value of $V_F$, the distance between junctions EJ and IJ and many other factors.

With switches $S_1$, $S_2$ and $S_3$ closed, application of time dependent signal source $V_S$ via coupling capacitor C modulates the density of the injected carriers, resulting in light modulation. This modulated light carries information (represented by $V_S$) which can be optically coupled to a detector 170. The detector 170 may be embodied in the same chip or may be external to the chip.

$R_S$ and $R_L$ determine the currents in the respective circuits. $S_1$, $S_2$ and $S_3$ are shown as switches in FIG. 18 but they may be representing switching, driving and signal processing circuits, as well as other circuits.

Figure 19:
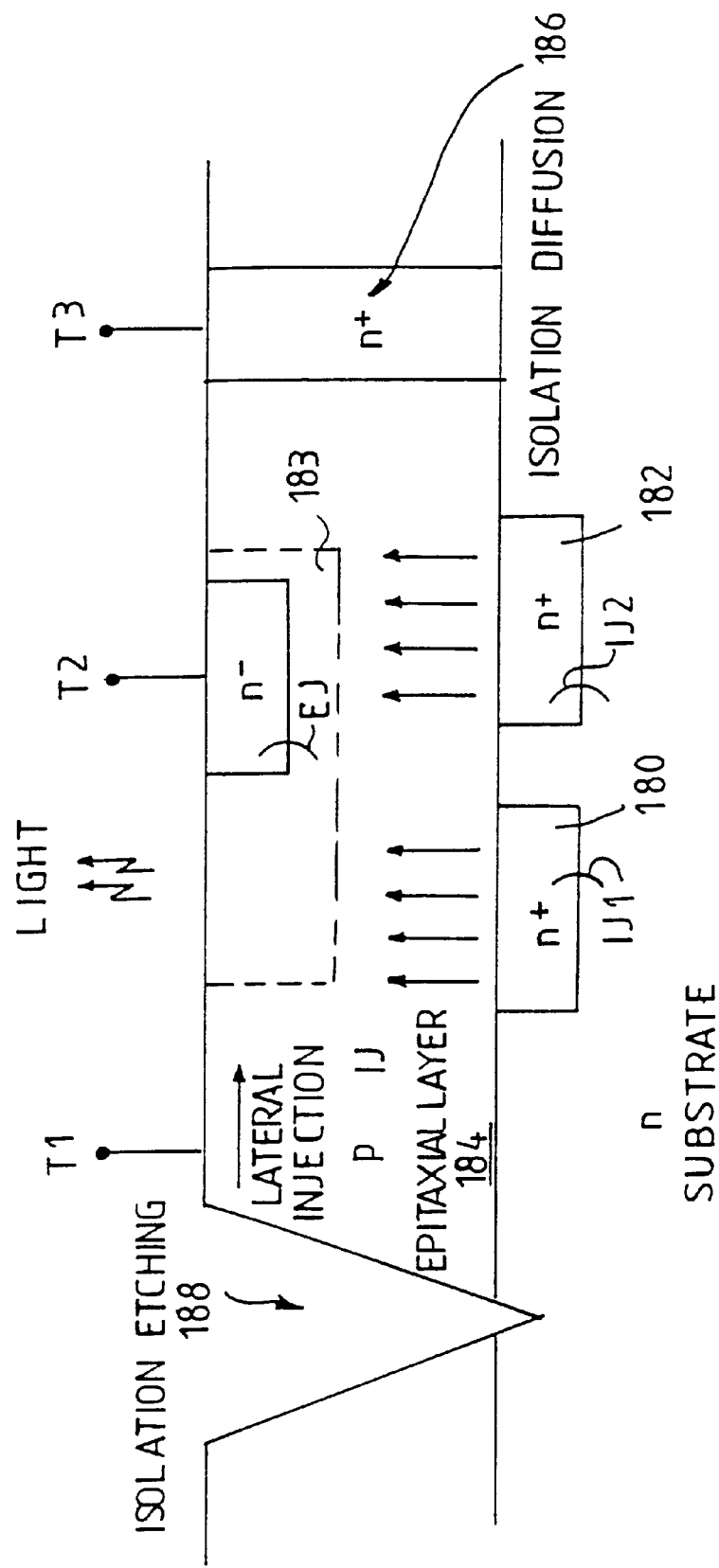
FIG. 19 is a sectional view of a device illustrating vertical carrier injection from two buried layers into the light emitting junction.

In FIG. 19 buried n⁻ layers 180 in a p epitaxial layer 184 are shown for the purpose of demonstrating the possibilities of vertical injection. First injection junction IJ1 is intended to induce light generation from the extended depletion region spreading more towards the epitaxial lever contact T1 of the emitting junction EJ. Second injection junction IJ2 is intended to induce light generation from an area between the emitting junction EJ and the injection junction IJ2, as well as from the perimeter of the emitting junction EJ. Other buried layer positions may be utilized in order to enhance light generation from other regions of the device.

The light generation occurs as soon as the n⁺ buried layer potential is made more negative than the p epitaxial layer 184, thus forward biasing the injection junction IJ1 and IJ2 via Terminal, T1 and T3. This placement of the terminal T1 will cause the depletion region 183 to extend laterally more towards the T1 contact than in the other lateral directions, thus increasing the overlap with the IJ1 junction and increasing near-surface light generation. Under such conditions a forward biased n⁺p junction inject carriers (mainly electrons in this example) which move towards the high field space charge region or depletion region 183 of the emitting junction EJ, where they participate in the multiplication action.

Signal mixing and processing is possible if both laterally and vertically spaced junctions are injecting carriers into the space charge region 183 of the emitting junction EJ. Each of the above injecting junctions, as well as other added junctions, may also be operated at reverse bias avalanching action as hereinbefore described. This then supplies photons for carrier generation in the depletion region 183 of EJ, loading to carrier multiplication and light generation in the emitting junction EJ.

Devices where both electronic and photonic control of the light emission are performed can also be realized where one IJ junction is forward biased (electronic carrier injection to EJ) and another IJ junction Is reverse biased (photonic injection to EJ).

A signal processing unit comprising several injection junctions IJ and an emitting junction EJ may be electrically isolated from other signal processing units on the same chip by isolation diffusions 186, shown in FIG. 19 or micromachined etching of the silicon surface shown at 188 in FIG. 19. The micromachined etching can also act as light reflecting surfaces to isolate devices optically in the lateral direction, since the etched surfaces will reflect lateral light towards the back of the semi-conductor wafer. By leaving windows in the isolation etching, lateral light emission can be directed in selected directions (where etching was not performed) within the bulk material from the emitting junction EJ. The buried layers 180 and 182 shown in FIG. 19 may also be used as optical waveguides to transmit light in the silicon structure.

Multi-junction operation can be achieved in several ways, which can be described with reference to the diagram in FIG. 20.

Several injecting junction IJ1 to IJn are produced in the vicinity of an emitting junction EJ. A diagrammatic illustration which shows the top surface of the silicon chip is presented in FIG. 20.

Under conditions where the junctions are connected to circuitry that reverse biases the EJ at or near $V_B$ and forward biases the various injecting junctions IJ1 to IJn, the EJ receives additional carriers injected from those forward biased injected junctions IJ to IJn. As a result signal mixing and processing of multiplication information can be performed resulting in an optical signal output carrying the desired information.

The structure configuration and the distances D1, D2, Dn of the injecting junctions IJ1 to IJn from EJ may be identical or different according to the specific use. The areas of the injecting junctions IJ1 to IJn facing the EJ may be similar or different and depend on the anticipated strength of the respective signals and mixing or signal processing characteristics. Similarly, the areas of the EJ facing the various injecting junctions IJ1 to IJn may be similar or different.

The injection junctions IJ1 to IJn and the emitting junction EJ may be interchanged by simply biasing them with opposite polarities.

It will be appreciated that there are many variations in detail on the device and method of producing same according to the invention without departing from the scope and spirit of this disclosure.

We claim:

1. A semiconductor device comprising:
   a layer of an indirect bandgap semiconductor material of a first conductivity type, the layer having a main surface;
   an arrangement of concentric interconnected formations of semiconductor material of a second conductivity type embedded in the layer and defining with the layer metallurgical interfaces that extend from within the layer to the main surface;
   a first electrical contact terminal on the main surface connected to the layer at a contact region at the centre of the arrangement and a second electrical contact connected to a formation in the arrangement.

2. A semiconductor light emitting device including:
   a layer of an indirect bandgap semiconductor material having a main surface and being of a first conductivity type and having a first doping concentration;
   a light emitting surface breakdown mechanism comprising an arrangement of laterally spaced concentric formations of a second conductivity type shallowly embedded into the layer and defining laterally facing metallurgical interfaces between the layer and the formations, the interfaces extending up to the main surface; and
   first and second electrical contact terminals on the main surface connected to the layer via a contact region at the centre of the arrangement and to the arrangement, respectively, for receiving a reverse breakdown voltage in a lateral direction in the device in a main surface region thereof to cause breakdown in the region of the interfaces of the surface breakdown mechanism and light to be emitted from the interfaces.

3. The device of claim 2 wherein the arrangement comprises concentric interconnected formations.

4. The device of claim 1, claim 2 or claim 3 wherein the layer has a first doping concentration and is a base layer embedded in an epitaxial layer of the first conductivity type and wherein the first doping concentration is higher than a doping concentration of the epitaxial layer.

5. The device of claim 1 or claim 2 wherein the layer has a first doping concentration, and wherein the contact region is of the first conductivity type and has a doping concentration higher than the first doping concentration.

6. The device of claim 1 or claim 2 wherein the formations are rings.

7. The device of claim 1 or claim 2 wherein the second electrical contact is connected to the formation in the arrangement laterally furthest away from the first contact terminal.

8. The device of claim 1 or claim 2 comprising at least one electronic control gate located on the main surface between adjacent formations of the arrangement, to enable selection of a preferential breakdown position in the arrangement.

9. The device of claim 8 wherein the at least one control gate is located on an insulating layer covering said main surface, wherein the control gate comprises a resistive material and is located between two formations of the arrangement.

10. The device of claim 8 comprising a plurality of gates which are interconnected by resistive links extending between the gates to provide a potential gradient between the gates.

11. A method for generating light comprising applying a reverse breakdown voltage in a lateral direction on a light emitting semiconductor device comprising a layer of an indirect bandgap semiconductor material of a first conductivity type having a main surface and having a first doping concentration and a light emitting surface breakdown mechanism located in the main surface, the surface breakdown mechanism including an arrangement of laterally spaced concentric formations of a second conductivity type shallowly embedded into the layer and defining laterally facing metallurgical interfaces between the layer and the formations extending up to the main surface, wherein the applied reverse bias breakdown voltage causes light to be emitted from the interfaces.

12. The method of claim 11 wherein the layer is a base layer embedded in an epitaxial layer of the first conductivity type and wherein the first doping concentration is higher than a doping concentration of the epitaxial layer.

13. The method of claim 11 or claim 12 comprising applying the voltage between first and second electrical contact terminals on the main surface, the terminals being connected to the layer via a contact region at the centre of the arrangement and to the arrangement, respectively.

14. The method of claim 13 rising applying the voltage to a contact region of the first conductivity type having a doping concentration that is higher than the first doping concentration of the layer.

15. The method of claim 13 or claim 12 comprising applying the voltage to a second contact terminal connected to the formation laterally furthest away from the first contact terminal.

* * * * *